(12) United States Patent
Yada et al.

(10) Patent No.: US 9,793,288 B2
(45) Date of Patent: Oct. 17, 2017

(54) METHODS OF FABRICATING MEMORY DEVICE WITH SPACED-APART SEMICONDUCTOR CHARGE STORAGE REGIONS

(71) Applicant: SanDisk Technologies, Inc., Plano, TX (US)

(72) Inventors: Shinsuke Yada, Yokkaichi (JP); Hiroyuki Kamiya, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 230 days.

(21) Appl. No.: 14/560,308

(22) Filed: Dec. 4, 2014

(65) Prior Publication Data
US 2016/0181271 A1   Jun. 23, 2016

(51) Int. Cl.
*H01L 27/11582* (2017.01)
*H01L 27/1157* (2017.01)
*H01L 21/3205* (2006.01)

(52) U.S. Cl.
CPC .... *H01L 27/11582* (2013.01); *H01L 27/1157* (2013.01); *H01L 21/32055* (2013.01)

(58) Field of Classification Search
CPC ........... H01L 21/32055; H01L 27/1157; H01L 27/11582
See application file for complete search history.

(56) References Cited

U.S. PATENT DOCUMENTS

| | | | |
|---|---|---|---|
| 4,782,030 A | * | 11/1988 | Katsumata .............. H01L 21/32 148/DIG. 10 |
| 5,807,788 A | | 9/1998 | Brodsky et al. |
| 5,915,167 A | | 6/1999 | Leedy |
| 7,177,191 B2 | | 2/2007 | Fasoli et al. |

(Continued)

FOREIGN PATENT DOCUMENTS

WO   WO02/15277 A2   2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Bilkis Jahan
*Assistant Examiner* — Victor Barzykin
(74) *Attorney, Agent, or Firm* — The Marbury Law Group PLLC

(57) ABSTRACT

Methods of fabricating semiconductor devices, such as monolithic three-dimensional NAND memory string devices, include selectively forming semiconductor material charge storage regions over first material layers exposed on a sidewall of a front side opening extending through a stack comprising an alternating plurality of first and second material layers using a difference in incubation time for the semiconductor material on the first material relative to an incubation time for the semiconductor material on the sec- (Continued)

ond material of the stack. In other embodiments, a silicon layer is selectively deposited on silicon nitride on a surface having at least one first portion including silicon oxide and at least one second portion including silicon nitride using a difference in an incubation time for the silicon on silicon nitride relative to an incubation time for the silicon on silicon oxide.

19 Claims, 13 Drawing Sheets

(56) References Cited

U.S. PATENT DOCUMENTS

| | | | |
|---|---|---|---|
| 7,221,588 B2 | 5/2007 | Fasoli et al. | |
| 7,233,522 B2 | 6/2007 | Chen et al. | |
| 7,378,353 B2 | 5/2008 | Lee et al. | |
| 7,514,321 B2 | 4/2009 | Mokhlesi et al. | |
| 7,575,973 B2 | 8/2009 | Mokhlesi et al. | |
| 7,608,195 B2 | 10/2009 | Wilson | |
| 7,648,872 B2 | 1/2010 | Benson | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,093,725 B2 | 1/2012 | Wilson | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,283,228 B2 | 10/2012 | Alsmeier | |
| 8,349,681 B2 | 1/2013 | Alsmeier et al. | |
| 8,415,742 B2 | 4/2013 | Kim et al. | |
| 2006/0102586 A1 | 5/2006 | Lee et al. | |
| 2007/0210338 A1 | 9/2007 | Orlowski | |
| 2007/0252201 A1 | 11/2007 | Kito et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0256247 A1 | 10/2012 | Alsmeier | |
| 2013/0122712 A1 | 5/2013 | Kim et al. | |
| 2013/0224960 A1 | 8/2013 | Payyapilly et al. | |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2014/0008714 A1 | 1/2014 | Makala et al. | |
| 2014/0225181 A1 | 8/2014 | Makala et al. | |
| 2014/0295636 A1* | 10/2014 | Makala | H01L 29/66833 438/287 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibo.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM—2010 Proceedings, Dec. 6-8, 2010, pp. 668-671.
Y.S. Kim et al., "Direct Copper Electroless Deposition on a Tungsten Barrier Layer for Ultralarge Scale Integration," Journal of the Electrochemical Society, vol. 152 (2) 2005.
Au, Y. et al., "Filling Narrow Trenches by Iodine-Catalyzed CVD of Copper and Manganese on Manganese Nitride Barrier/Adhesion Layers," Journal of the Electrochemical Society, vol. 158 (5) 2011.
K. R. Williams et al., "Etch Rates for Micromachining Processing," Journal of Microelectromechanical Systems, vol. 5, No. 4, Dec. 1996.
K. R. Williams et al., "Etch Rates for Micromachining Processing Part II," Journal of the Microelectromechanical Systems, vol. 12, No. 6, Dec. 2003.
M. Claes et al., "Selective Wet Etching of HF-based Layers," Abstracts, 204th Meeting of the Electrochemical Society, 2003.
U.S. Appl. No. 13/762,988, filed Feb. 8, 2013, SanDisk Technologies Inc.
U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technolgies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
U.S. Appl. No. 14/319,283, filed Jun. 30, 2014, SanDisk Technologies Inc.
U.S. Appl. No. 14/456,515, filed Aug. 11, 2014, SanDisk Technologies Inc.
U.S. Appl. No. 14/560,351, filed Dec. 4, 2014, SanDisk Technologies Inc.
U.S. Appl. No. 14/560,444, filed Dec. 4, 2014, SanDisk Technologies Inc.
Endoh, et al., "Novel Ultra High Density Memory with a Stacked-Surrounding Gate Transistor (S-SGT) Structured Cell," IEDM Proc. (2001) 33-36.
Rem, J. B. et al., "Incubation Time Measurements in Thin-Film Deposition," J. Electrochem. Soc., vol. 144, No. 6, pp. 2101-2106 (1997).

* cited by examiner

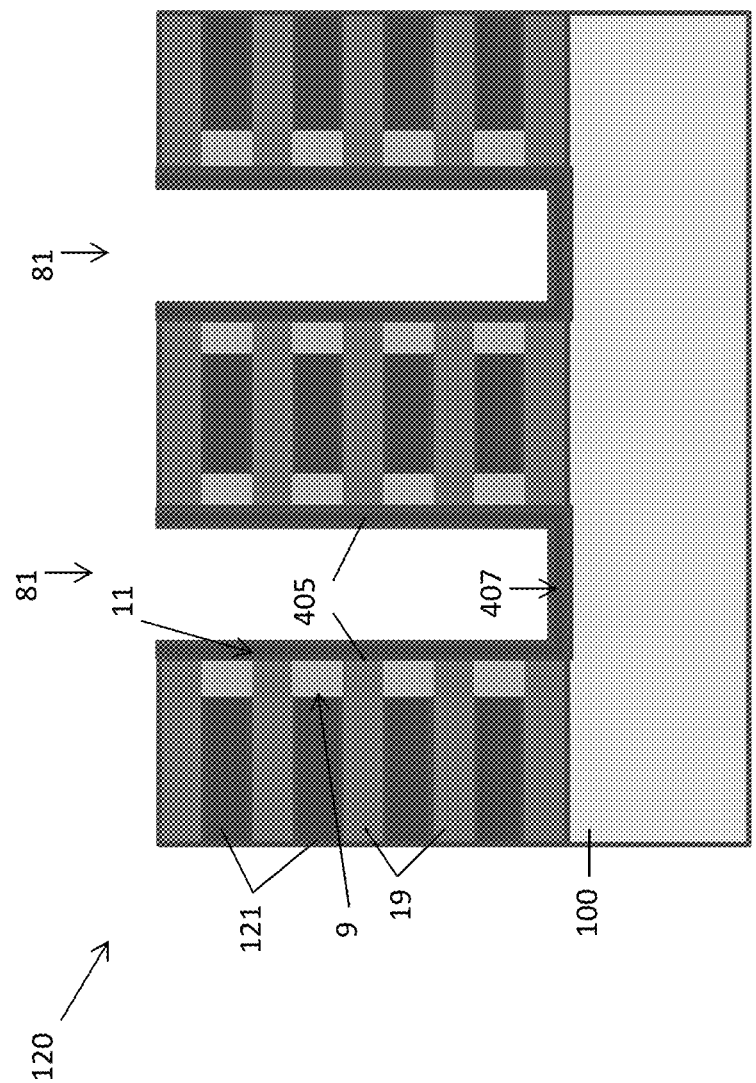

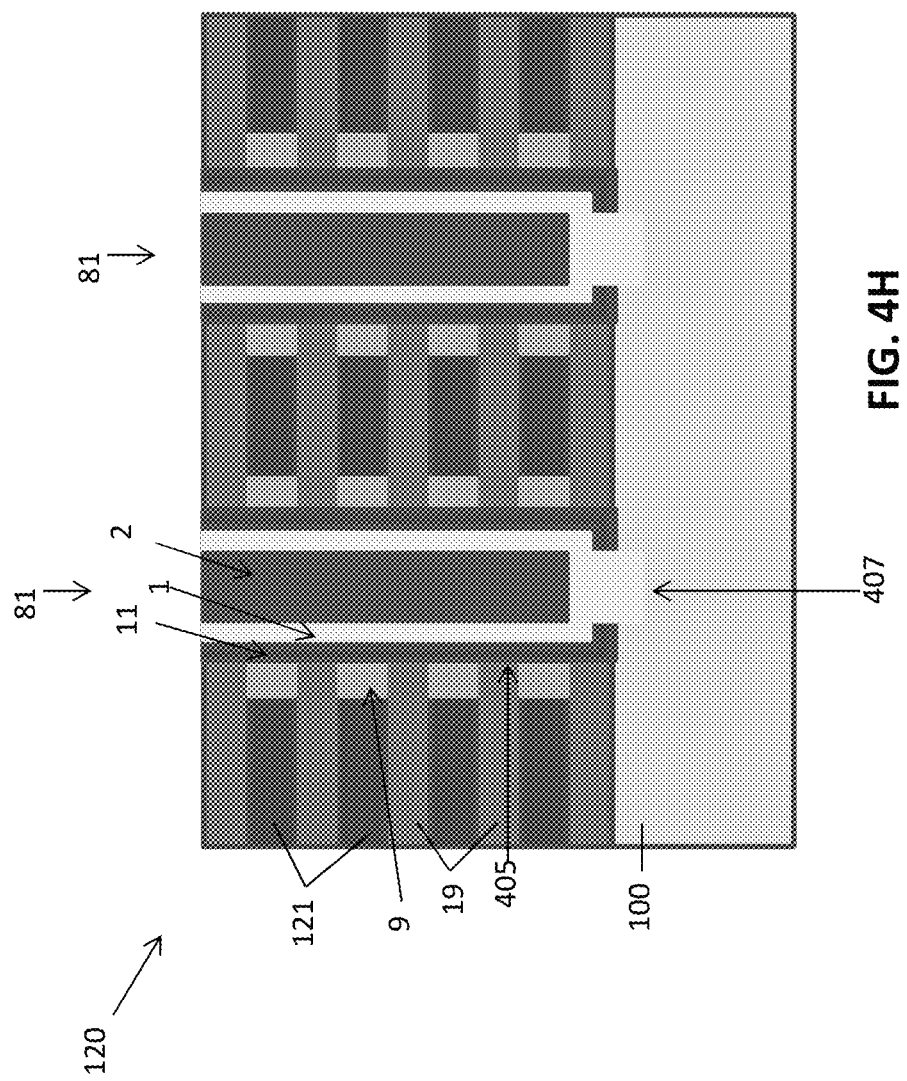

METHODS OF FABRICATING MEMORY DEVICE WITH SPACED-APART SEMICONDUCTOR CHARGE STORAGE REGIONS

FIELD

The present disclosure relates generally to the field of semiconductor devices and specifically to three dimensional vertical NAND strings and other semiconductor devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string that includes forming a stack of alternating layers of a first material and a second material different than the first material over a substrate, etching the stack to form a front side opening in the stack having a sidewall defined at least partially by the alternating layers of the first material and the second material, removing a first portion of the second material layers through the front side opening to form front side recesses between the first material layers, and forming vertically spaced apart charge storage regions including a semiconductor material within the front side recesses, where forming the vertically spaced apart charge storage regions includes forming a first layer of the semiconductor material over the first material layers exposed on the sidewall of the front side opening and over the second material layers exposed within the front side recesses, where a thickness of the first layer of semiconductor material formed over the second material layers is greater than a thickness of the first layer of semiconductor material formed over the first material layers due to a difference in an incubation time for the semiconductor material on the first material relative to an incubation time for the semiconductor material on the second material, and etching through the front side opening to remove first portions of the semiconductor material from over the first material layers on the sidewall of the front side opening to leave vertically spaced apart second portions of the semiconductor material within the front side recesses. The method further includes forming a tunnel dielectric layer over the charge storage regions in the front side opening, and forming a semiconductor channel over the tunnel dielectric layer in the front side opening.

Another embodiment relates to a method of fabricating a semiconductor device that includes depositing a silicon layer on a surface having at least one first portion including silicon oxide and at least one second portion including silicon nitride, where a thickness of the silicon layer over the at least one second portion is greater than a thickness of the silicon layer over the at least one first portion due to a difference in an incubation time for the silicon on silicon nitride relative to an incubation time for the silicon on silicon oxide, and etching the silicon layer to selectively remove the silicon from the at least one first portion of the surface and provide at least one discrete silicon segment over the at least one second portion of the surface.

BRIEF DESCRIPTION OF THE DRAWINGS

FIG. 1A is a side cross sectional view of the device along line Y-Y' in FIG. 1B, while FIG. 1B is a side cross sectional view of the device along line X-X' in FIG. 1A.

FIG. 2A is a side cross sectional view of the device along line Y-Y' in FIG. 2B, while FIG. 2B is a side cross sectional view of the device along line X-X' in FIG. 2A.

FIGS. 4A-4J are side cross sectional views illustrating a method of making a NAND string memory device according to one embodiment.

FIGS. 6A-6E schematically illustrates a selective deposition of silicon on a surface using a difference in an incubation time for the silicon on silicon nitride relative to an incubation time for the silicon on silicon oxide.

DETAILED DESCRIPTION

Various embodiments relate to methods of fabricating semiconductor devices, such as monolithic three-dimensional NAND memory string devices. In one embodiment, vertically spaced apart charge storage regions comprising a semiconductor material are selectively formed over first material layers exposed on a sidewall of a front side opening extending through a stack comprising an alternating plurality of first and second material layers using a difference in incubation time for the semiconductor material on the first material relative to an incubation time for the semiconductor material on the second material of the stack. In another embodiment, a silicon layer is selectively deposited on silicon nitride on a surface having at least one first portion including silicon oxide and at least one second portion including silicon nitride using a difference in an incubation time for the silicon on silicon nitride relative to an incubation time for the silicon on silicon oxide.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 1A:
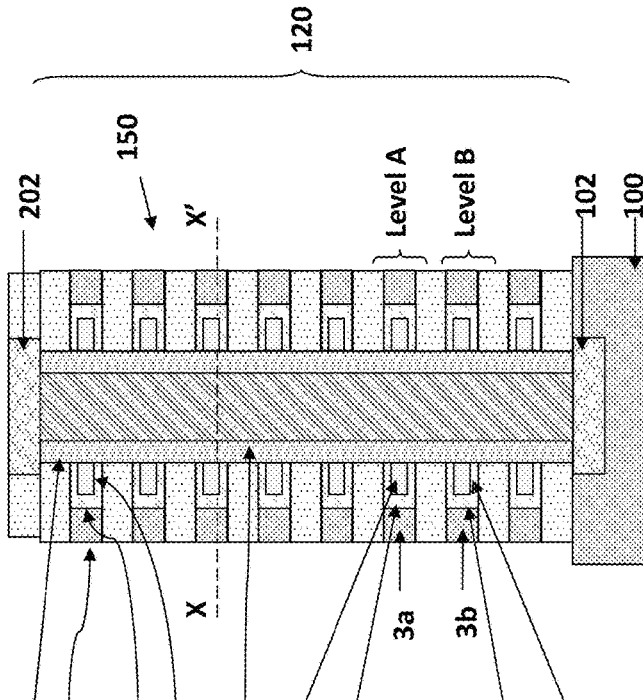
FIGS. 1A and 1B are respectively side cross sectional and top cross sectional views of a conventional NAND string.
Figure 2A:
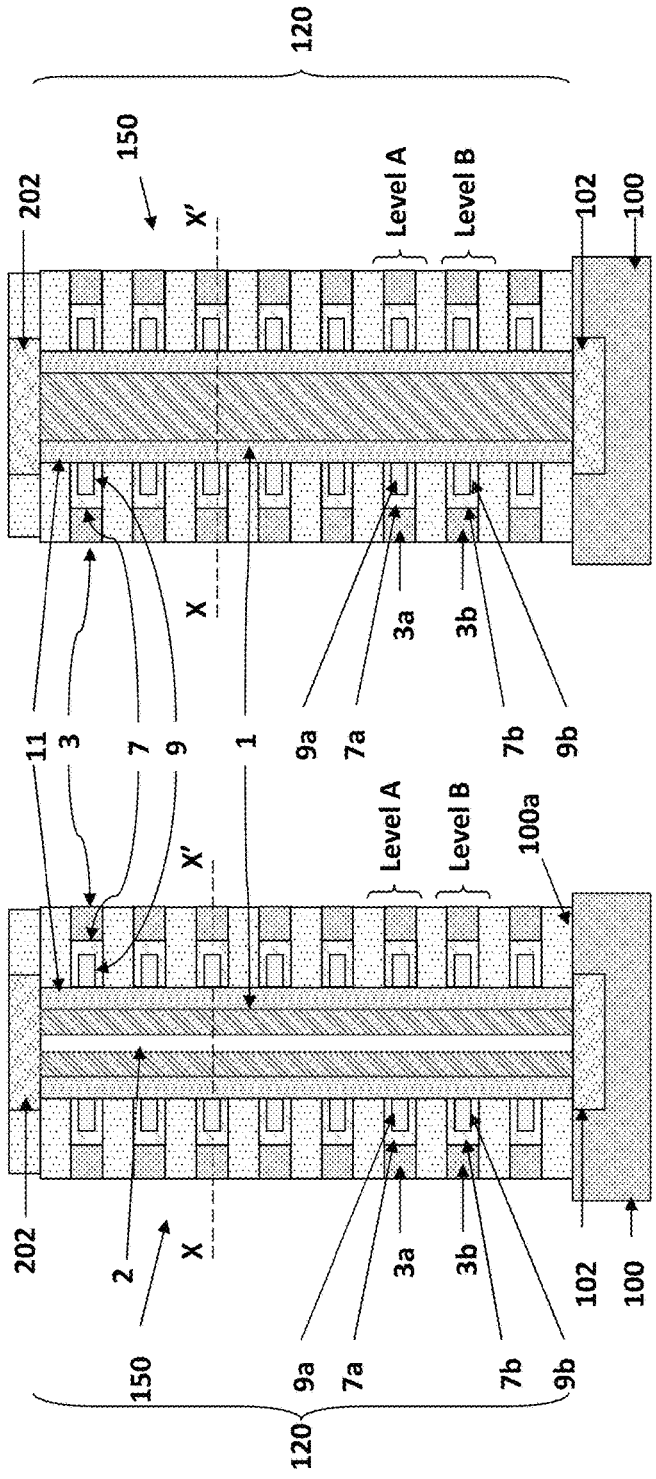
FIGS. 2A and 2B are respectively side cross sectional and top cross sectional views of another conventional NAND string.
Figure 3:
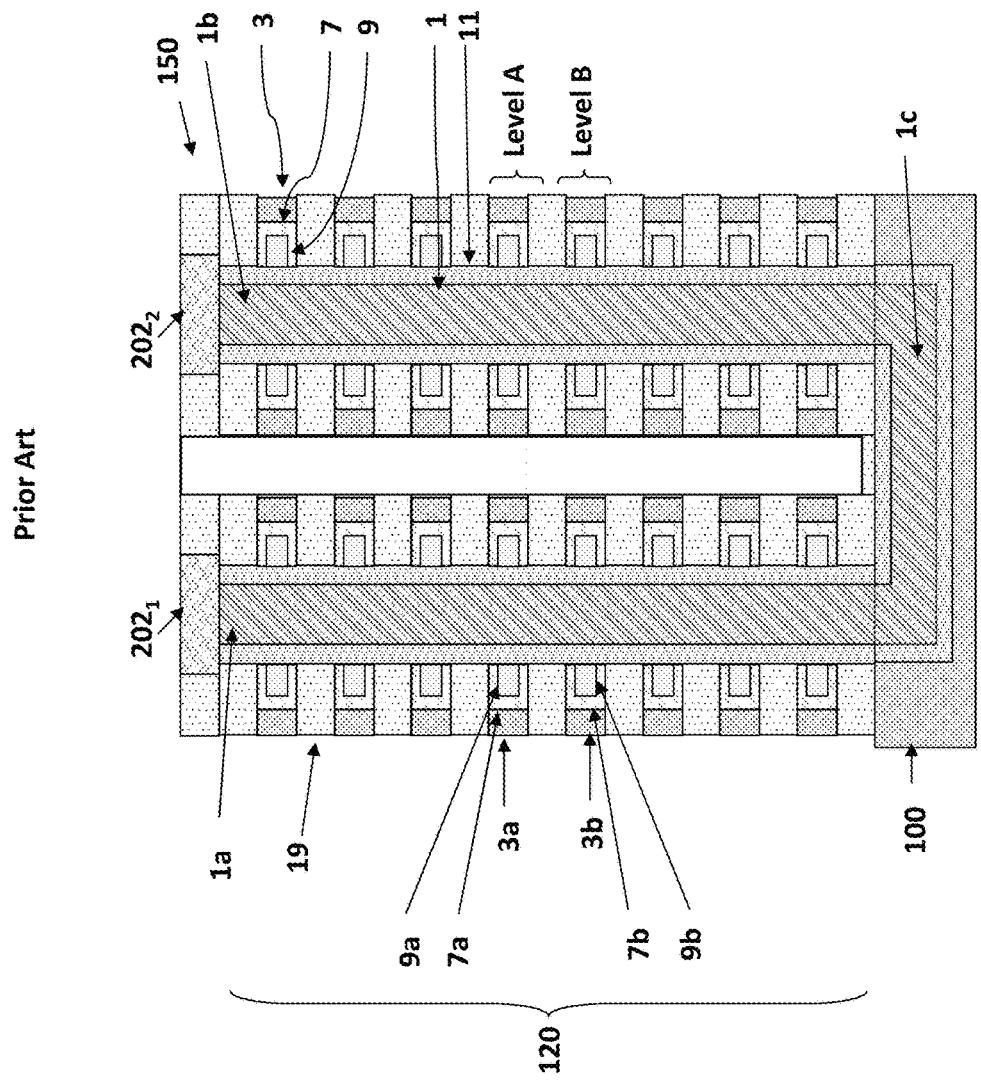
FIG. 3 is a side cross sectional view of a conventional NAND string of an embodiment with a U-shaped channel.

In some embodiments, the monolithic three dimensional NAND string 150 comprises a semiconductor channel 1 having at least one end portion extending substantially perpendicular to a major surface 100a of a substrate 100, as shown in FIGS. 1A, 2A and 3. "Substantially perpendicular to" (or "substantially parallel to") means within 0-10°. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A and 2A. The channels 1 may be electrically connected to first and second (e.g., source and drain) electrodes 102, 202 which are schematically shown in FIGS. 1A and 2A. The first (e.g., source) electrode 102 may connect to the bottom of the channel 1 and the second (e.g., drain electrode 202) may connect to the top of the channel 1. The NAND string 150 may further include drain-side and source-side select or access transistors (not shown in FIGS. 1A and 2A for clarity) which may be located above and below the memory levels of the NAND string 150, respectively.

Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional back gate electrode (not shown) may be disposed in the substrate 100 below the semiconductor channel 1. The NAND string 150 in this embodiment may further include drain-side and source-side select or access transistors (not shown in FIG. 3 for clarity), both of which may be located above the memory levels of the NAND string 150 and electrically connected to the respective wing portions 1a and 1b of the semiconductor channel 1.

Figure 1B:
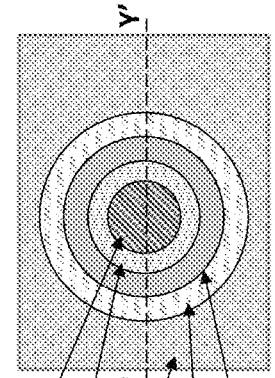
Figure 2B:
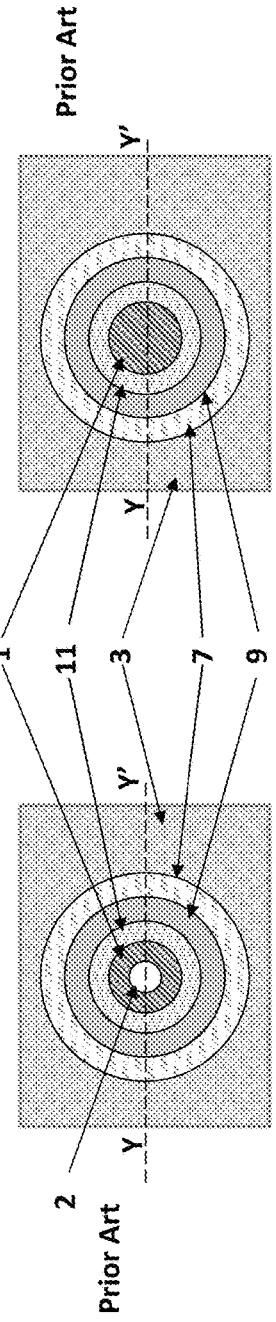

In some embodiments, the semiconductor channel 1 may be a filled feature, as shown in FIGS. 2A, 2B and 3. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3 may alternatively be a hollow cylinder filled with an insulating fill material 2, shown in FIGS. 1A-1B.

A memory array 180 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B and 3, electrically separated from each other by a plurality of electrically insulating layers 19 forming a stack 120 of alternating control gate electrodes 3 and insulating layers 19. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials.

A blocking dielectric 7 is located adjacent to the control gate(s) 3 and may surround charge storage region(s) 9, as shown in FIGS. 1A, 2A and 3. In other embodiments, described further below with reference to FIG. 4J, the blocking dielectric 7 may be located between the control gate 3 and the charge storage region 9 within each device level (i.e., Level A, Level B, etc.) and may surround the control gate 3 on the top, bottom and side surface of the control gate 3. Alternatively, a straight blocking dielectric layer 7 may be located only adjacent to an edge (i.e., minor surface) of each control gate 3. The blocking dielectric 7 may comprise one or more layers having a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3. Alternatively, the blocking dielectric 7 may be a straight, continuous layer, similar to the device described in U.S. Pat. No. 8,349,681 issued on Jan. 8, 2013 and incorporated herein by reference in its entirety.

The monolithic three dimensional NAND string also comprises a charge storage region 9. As shown in FIGS. 1A, 2A and 3, the charge storage region may comprise a plurality of discrete charge storage regions or segments 9 located between the blocking dielectric and the channel 1. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles. In some embodiments, described in further detail below, the charge storage regions 9 may be floating gates comprising amorphous silicon or polysilicon that may be formed by selective deposition on a first material (e.g., silicon nitride) within the stack 120.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

A first embodiment method of making a NAND string 150 is illustrated in FIGS. 4A-4J. In some embodiments, the methods described herein may be used to make a NAND string 150 having a plurality of discrete, vertically spaced apart charge storage regions 9 comprising a semiconductor material (e.g., silicon). The spaced apart charge storage regions 9 may prevent charge in a first device level from migrating to other device levels of the stack 120. In embodiments, the charge storage regions 9 may be formed by selectively depositing the semiconductor material (e.g., silicon) on a first material (e.g., silicon nitride) of the stack 120 using a difference in incubation time for the semiconductor material on the first material relative to a second material (e.g., silicon oxide) of the stack 120.

Figure 4A:
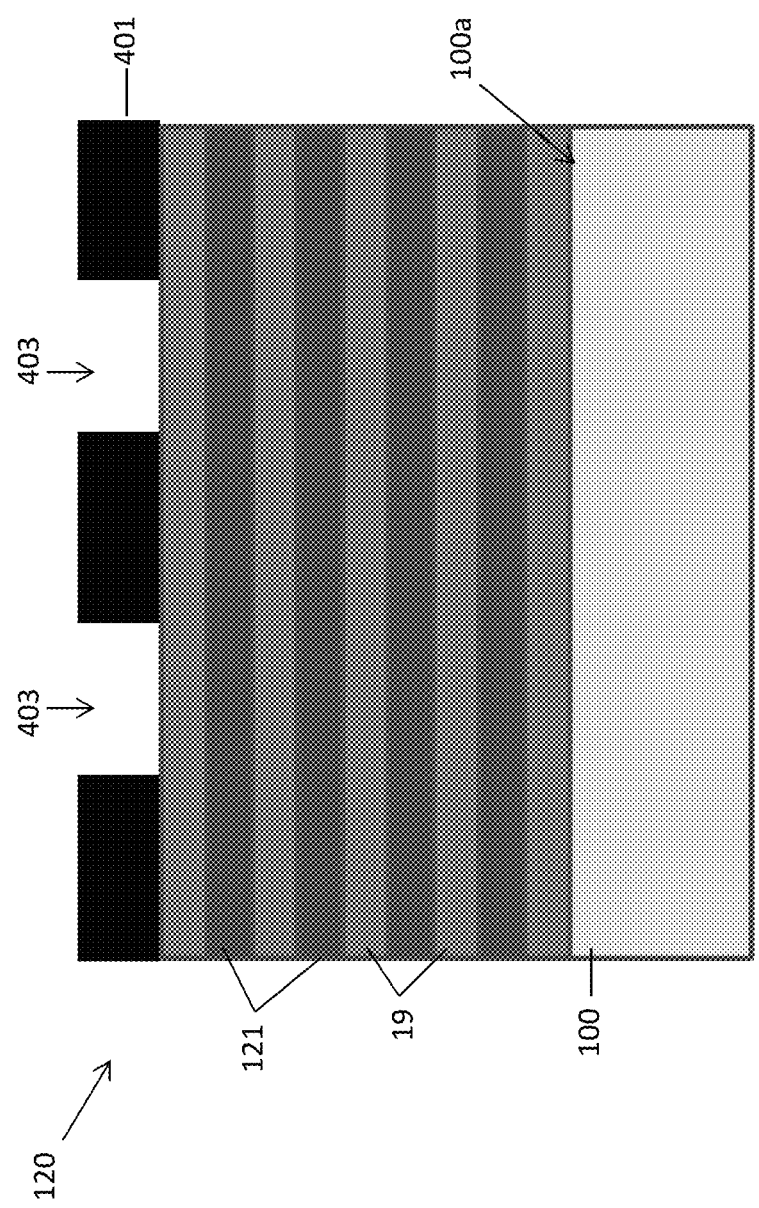

As illustrated in FIG. 4A, the method includes forming a stack 120 of alternating first material layers 19 and second material layers 121 over a major surface 100$a$ of substrate 100. The second material is different from the first material. The layers 19, 121 may be formed by a suitable deposition method, such as sputtering, CVD, PECVD, MBE, ALD, etc. The layers 19, 121 may be 6 to 100 nm thick.

In one embodiment, the first material layers 19 comprise an electrically insulating material, such as an oxide (e.g., silicon oxide, silicon oxynitride, a high-k dielectric, etc.). The second material layers 121 may comprise a sacrificial material, such as an insulating material that is different from the material of the first layers 19. For example, layers 19 may comprise silicon oxide (e.g., formed using a tetraethyl orthosilicate (TEOS) source) and layers 121 may comprise silicon nitride forming an ONON stack 120.

The formation of layers 19, 121 may be followed by etching the stack 120 to form at least one front side opening 81 in the stack 120. An array of front side openings 81 (e.g., cylindrical memory openings of holes) may be formed in locations where vertical channels of NAND strings 150 will be subsequently formed.

Figure 4B:
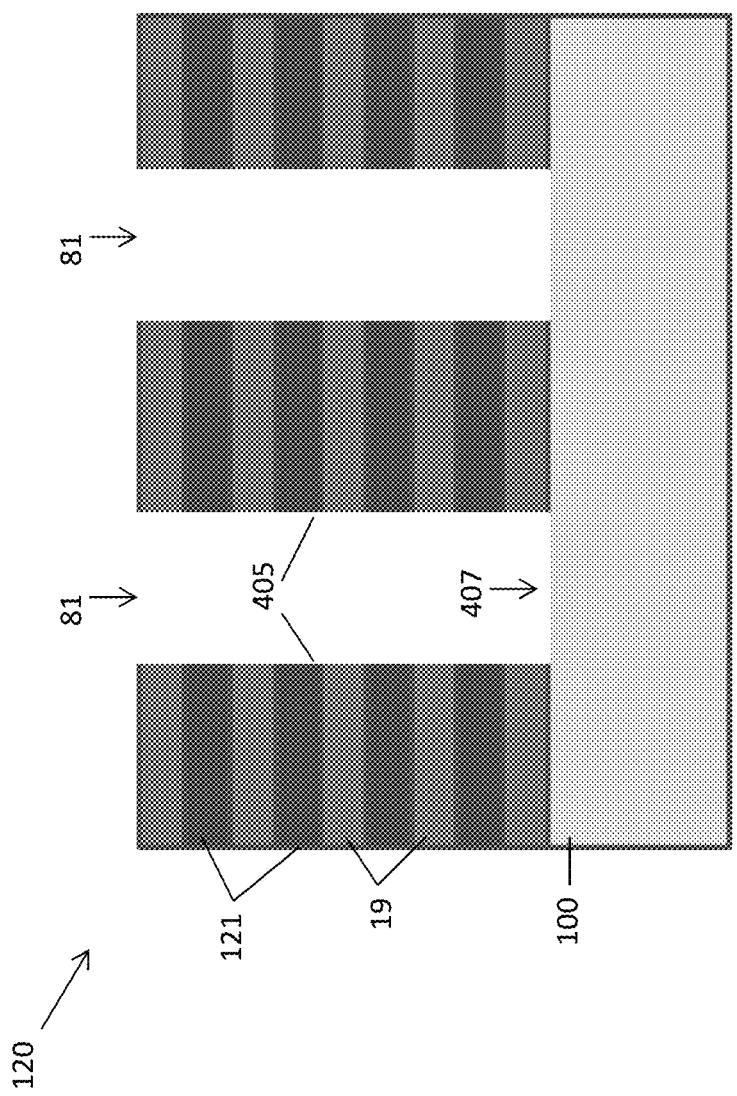

The front side openings 81 may be formed by photolithography and etching as follows. First, a memory hole mask 401 may be formed over the stack 120 and patterned to form openings 403 exposing the stack 120 as shown in FIG. 4A. The mask 401 may comprise any suitable material, such as one or more layer of photoresist and/or hard mask material. Then, the stack 120 may be etched (e.g., using reactive ion etching (RIE)) to form the openings 81 in the stack through the openings 403 in the mask 401 as shown in FIG. 4B. In the embodiment of FIG. 4B, the etching may be stopped at the substrate 100. Alternatively, an etch stop layer may be formed over the substrate and the etching may be stopped on the etch stop layer. Following the etching to form the front side memory openings 81, the mask 401 may be removed.

Each of the front side memory openings 81 may include a sidewall 405 defined by the exposed surfaces of the layers 19, 121 of the stack 120 and a bottom surface 407, which in this embodiment is defined by the exposed surface of the substrate 100.

Figure 4C:
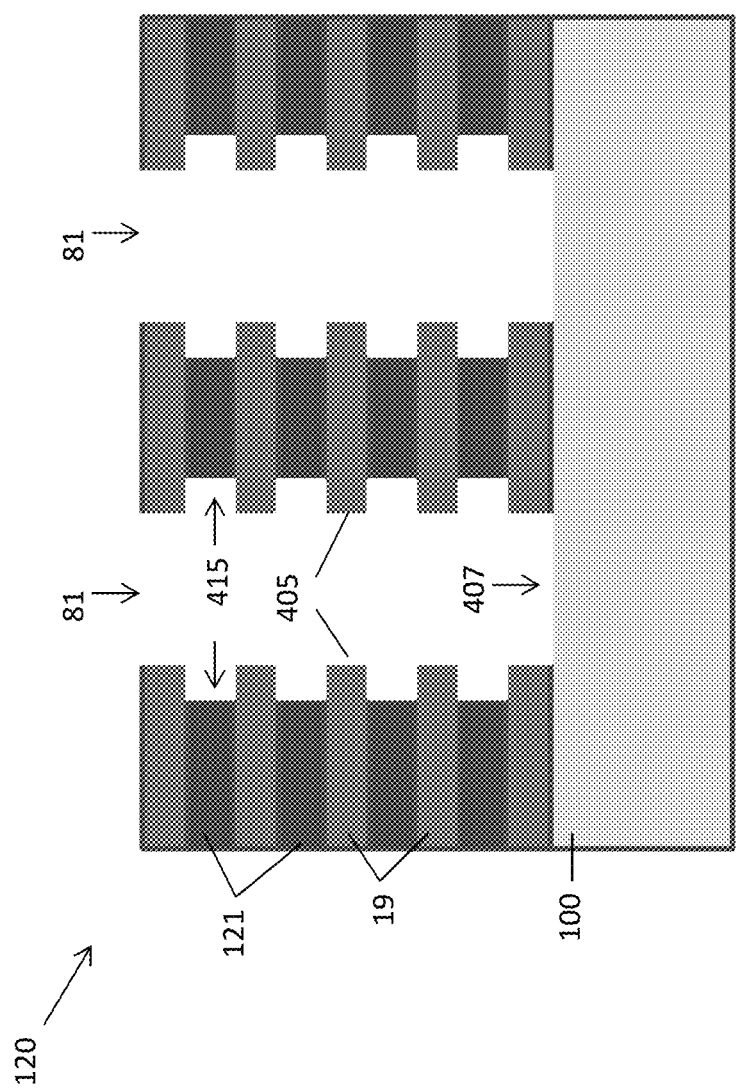

Referring to FIG. 4C, a first portion of the second material layers 121 is removed through the front side openings 81 to form front side recesses 415 between the first material layers 19. In embodiments, the second material layers 121 may comprise silicon nitride that is selectively etched relative to the material (e.g., silicon oxide) of the first material layers 19 to form the front side recesses 415. The layers 121 may be etched using a wet chemical etching process (e.g., using a hot phosphoric acid etch).

Figure 4D:
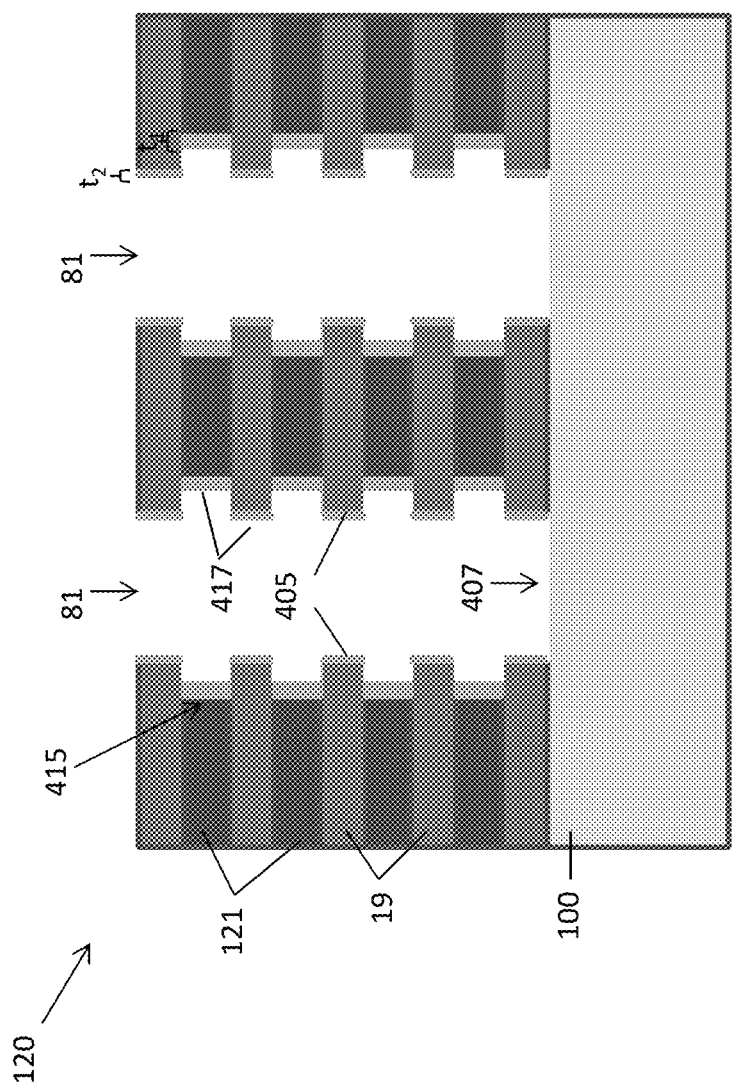
Figure 4E:
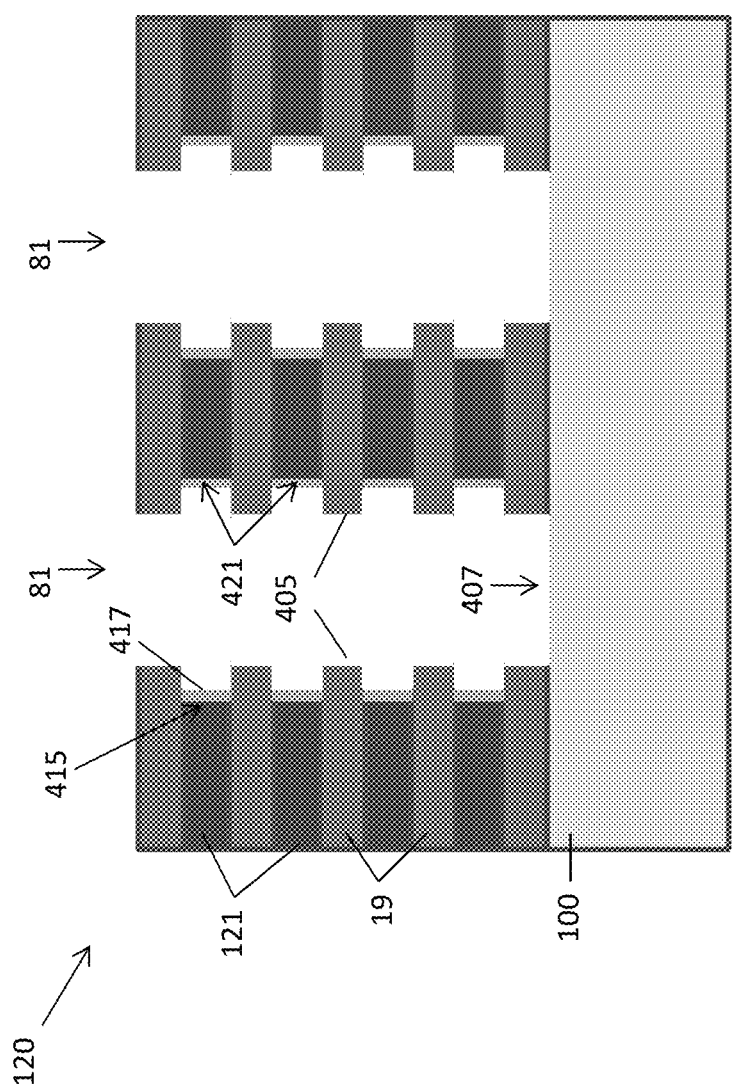

Next, a plurality of vertically spaced apart charge storage regions 9 may be formed within the front side recesses 415, as shown in FIGS. 4D-4E. Referring to FIG. 4D, a layer 417 of semiconductor material (e.g., amorphous silicon or polysilicon) is formed over the first material layers 19 exposed on the sidewall 405 of the front side opening 81 and over the second material layers 121 exposed within the front side recesses 415. The layer 417 may be formed using a suitable deposition method, such as chemical vapor deposition (CVD). A thickness, $t_1$, of the layer 417 over the second material layers 121 may be greater than a thickness, $t_2$, of the layer 417 over the first material layers 19, as shown in FIG. 4D. In embodiments, this differential in thickness may be due to a difference in incubation time for the semiconductor material on the first material layers 19 relative to the second material layers 121.

Figure 5:
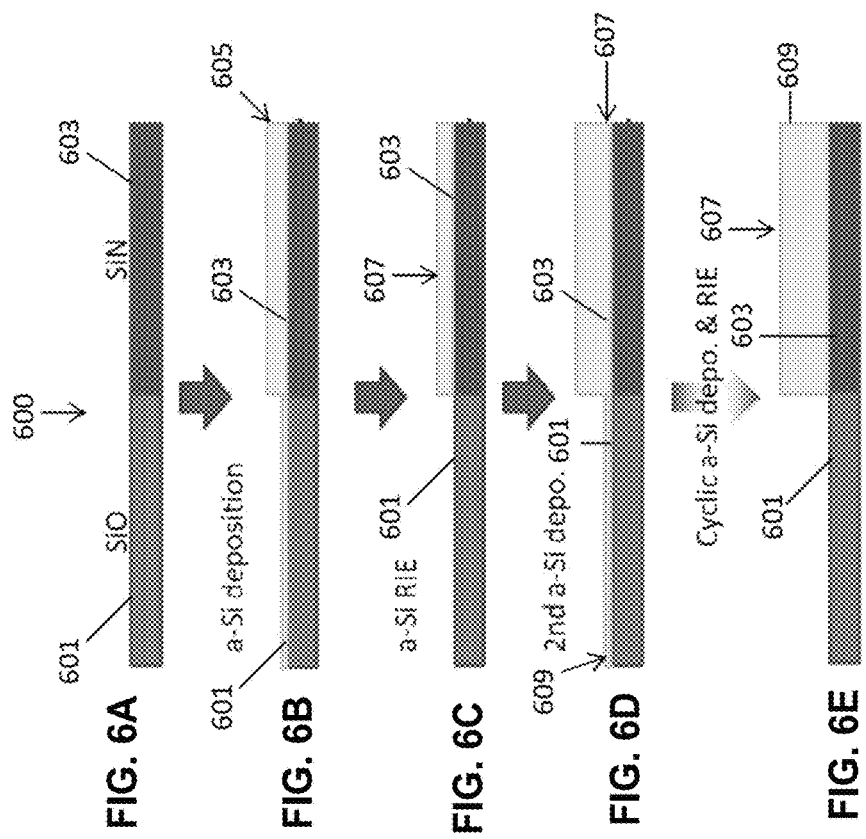
FIG. 5 is a plot illustrating the thickness of a silicon film formed on silicon, silicon nitride and silicon oxide materials as a function of time.
Figure 5:
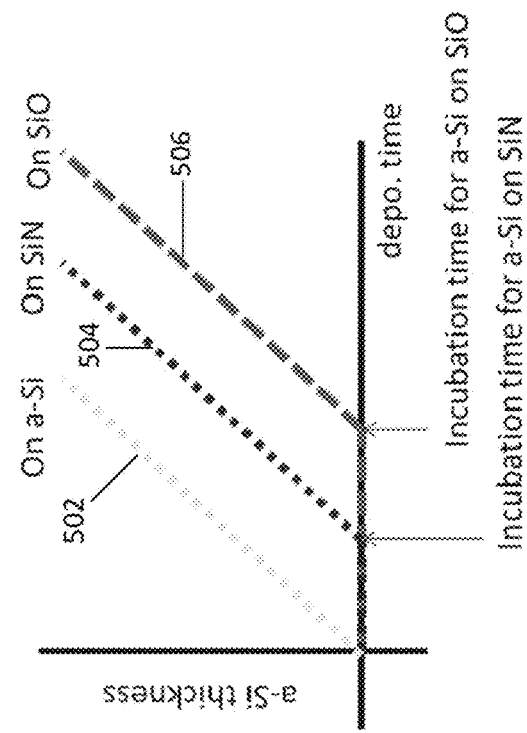

Incubation time refers to the time delay in the deposition of thin films on a surface by chemical or physical vapor deposition processes, and may be defined as the time difference between the start of the deposition process and the initial formation of nuclei on the surface from which the film grows. By way of example, FIG. 5 is a plot which schematically illustrates film thickness vs. deposition time for amorphous silicon formed on amorphous silicon 502, silicon nitride 504 and silicon oxide 506 surfaces via CVD. As is seen in FIG. 5, the thickness of the amorphous silicon film on the amorphous silicon surface begins to increase essentially immediately after the deposition process starts (see 502), meaning that the incubation time for a-Si on a-Si is relatively short. On the silicon nitride surface (see 504), there is a noticeable time delay before the thickness of the a-Si film begins to increase, which corresponds to the incubation time for a-Si on silicon nitride (labeled "SiN" for brevity to include stoichiometric $Si_3N_4$ and non-stoichiometric $Si_3N_{4\pm x}$). On the silicon oxide surface (see 506) there is an even greater time delay before the a-Si film thickness begins to increase, which corresponds to the incubation time for a-Si on silicon oxide (labeled "SiO" for brevity to include stoichiometric $SiO_2$ and non-stoichiometric $SiO_{2\pm x}$). Thus, the incubation time for a-Si on SiO is greater than the incubation time for a-Si on SiN, which is greater than the incubation time for a-Si on a-Si. Accordingly, for a given time during the deposition process, the thickness of the amorphous silicon layer formed on the amorphous silicon surface is greater than the thickness of the layer on the silicon nitride and silicon oxide surfaces, respectively. In addition, for a given time during the deposition process following the initial incubation time for a-Si on SiN, the thickness of the amorphous silicon layer formed on the SiN surface is greater than the thickness of the layer on the silicon oxide surface.

This difference in incubation times may be used to selectively deposit a layer on a first material (e.g., silicon nitride) relative to a second material (e.g., silicon oxide). This is schematically illustrated in FIGS. 6A-6E, which depict a surface 600 having a first portion 601 comprising silicon oxide (SiO) and a second portion 603 comprising silicon nitride (SiN). Referring to FIG. 6B, first layer 605 of amorphous silicon (a-Si) may formed over the surface 600 via a suitable process, such as CVD. The thickness of the first layer 605 over the second portion 603 is greater than the thickness of the first layer 605 over the first portion 601 due to the difference in incubation time for the silicon on silicon nitride relative to the incubation time for silicon on silicon oxide. Referring to FIG. 6C, the first layer 605 may be etched to selectively remove the amorphous silicon from the first (silicon oxide) portion 601 and leave a discrete segment 607 of amorphous silicon over the second (silicon nitride) portion 603. The layer 605 may be etched using a suitable etching process, such as a reactive ion etching (RIE) process and/or etching using a halogen containing gas flow. A halogen containing gas includes a halogen gas, such as chlorine ($Cl_2$) gas, or a halide gas, such as HBr, $CF_4$, $NF_3$ or $SF_6$. Due to the difference in the thickness of the layer 605 over the second portion 603 relative to the first portion 601 (see FIG. 6B), the etching may completely remove the layer 605 from over the first portion 601 and may only partially remove the layer 605 from over the second portion 603, thus providing the discrete segment 607 over the second portion 603 of the surface 600. The etch may be timed to remove all amorphous silicon from the SiO portion 601 but leave some amorphous silicon on the SiN portion 603. Alternatively, the etch may include end point detection where the etch is stopped as soon as SiO etch product from the SiO portion 601 is detected.

Referring to FIG. 6D, a second layer 609 of amorphous silicon (a-Si) may be formed over the surface 600 via a suitable process, such as CVD. The thickness of the second layer 609 over the discrete segment 607 may be greater than the thickness of the second layer 609 over the first portion 601 due to the difference in incubation time for the silicon on the silicon material of the segment 607 relative to the incubation time for silicon on the silicon oxide material of the first portion 601. Referring to FIG. 6E, the second layer 609 may be etched to selectively remove the amorphous silicon from the first (silicon oxide) portion 601, where at least a portion of the second layer 609 may remain on the discrete segment 607 over the second (silicon nitride) portion 603 of the surface 600. The second layer 609 may be etched using a suitable etching process, such as a reactive ion etching (RIE) process and/or a halogen containing gas etch, to leave a portion of layer 609 on the surface of the second portion 603. The same etch as before may be used.

The steps of depositing a silicon layer and etching the silicon layer to selectively remove the layer from the first (silicon oxide) portion 601 may be repeated on or more times to provide a discrete segment 607 of silicon material having a pre-determined thickness.

The general technique shown in FIGS. 6A-6E may applicable in some embodiments for forming discrete, vertically spaced apart silicon charge storage regions 9 in a vertical NAND string 150. Referring again to FIG. 4D, the layer 417 of semiconductor material (e.g., amorphous silicon or polysilicon) within the front side opening 81 may be formed having a greater thickness ($t_1$) over the second material layers 121 exposed within the front side recesses 415 than the thickness ($t_2$) over the first material layers 19 on the sidewall 405 of the front side opening 81 due to the difference in incubation time of the semiconductor material (e.g., silicon) on the first material (e.g., silicon oxide) relative to the incubation time for the semiconductor material on the second material (e.g., silicon nitride) of the stack 120. Referring to FIG. 4E, the stack 120 may be etched through the front side opening 81 to remove the layer 417 of semiconductor material from over the first material layers 19 on the side wall 405 of the front side opening 81 to leave vertically spaced apart second portions 421 of the semiconductor material layer 417 within the front side recesses 415 in silicon nitrides layers 121. The layer 417 may be etched using a suitable etching process, such as a reactive ion etching (RIE) process and/or a halogen containing gas etch.

Figure 4F:
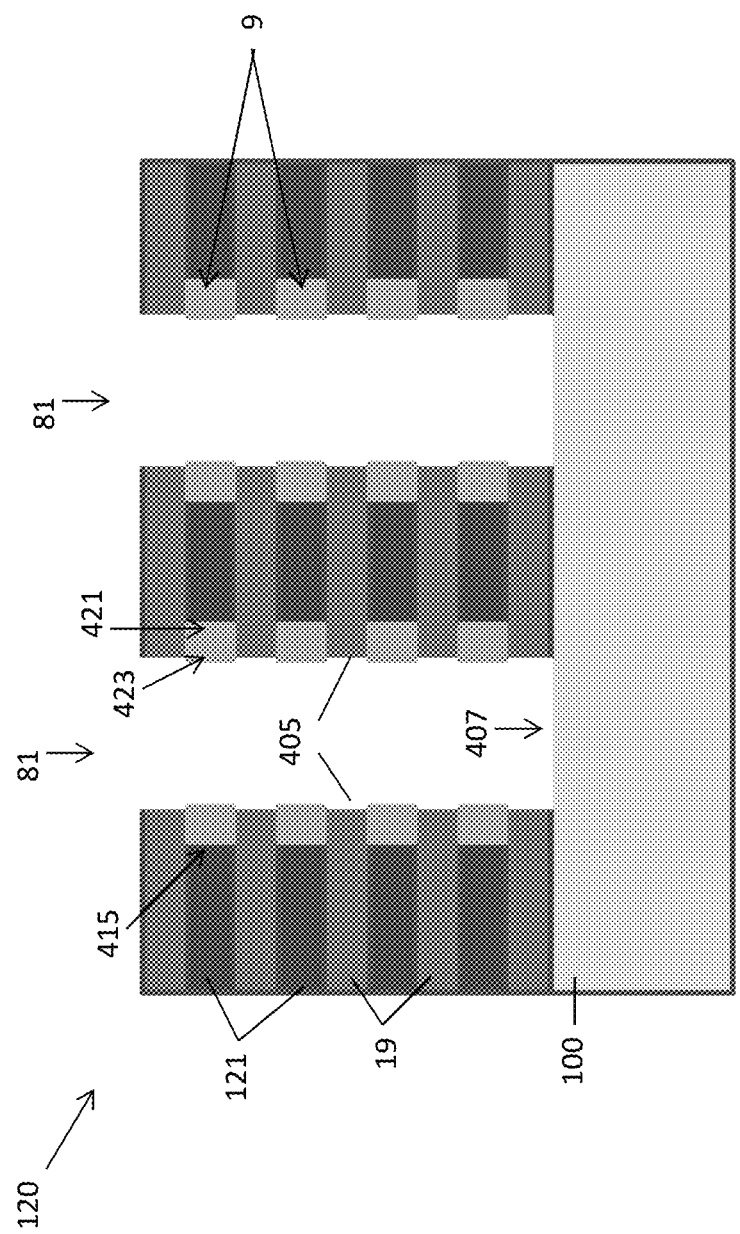

A second layer 423 of the semiconductor material may then be formed over the first material layers 19 exposed on the sidewall 504 of the front side opening and over the second portions 421 of the first semiconductor material layer 417 within the front side recesses 415, and the second layer 423 may be removed from over the first material layers 19 by etching, as described above. FIG. 4F illustrates the second layer 423 over the second portions 421 of the first semiconductor material layer 417 within the front side recesses 415 and removed from over the first material layers 19 on the sidewall 405 of the front side opening 81. The thickness of the second layer 423 formed within the front side recesses 415 may be greater than the thickness of the second layer 423 formed over the first material layers 19 due to the difference in incubation time for the semiconductor material on the first material (e.g., silicon oxide) relative to the incubation time for the semiconductor material on the first layer 417 of semiconductor material. The steps of forming layers of semiconductor material over the first material layers 19 exposed on the sidewall 405 of the front side opening and over the second portions 421 of semiconductor material within the front side recesses 415 and etching to remove the semiconductor material from over the first material layers 19 may be repeated until a desired thickness of the semiconductor material within the front side recesses 415 is obtained. As shown in FIG. 4F, the process may be repeated until the semiconductor material substantially fills the front side recesses 415 to provide vertically spaced apart charge storage regions 9 along the sidewall 405 of the front side opening 81.

Referring to FIG. 4G, a tunnel dielectric 11 may be formed within the front side opening 81, including over the charge storage regions 9 on the sidewall 405 of each of the front side memory openings 81, and may also be formed over the bottom surface 407 of the front side openings 81. The tunnel dielectric 11 may include one or more layers of an insulating material (e.g., an oxide, such as a silicon oxide, silicon oxynitride, and/or a high-k dielectric material). In the embodiment of FIG. 4G, the tunnel dielectric 11 comprises multiple layers of insulating materials.

Referring to FIG. 4H, the tunnel dielectric 11 may be removed from the bottom surface 407 of the front side opening 81 by an anisotropic etching process (e.g., a reactive ion etch (RIE) process) to expose the substrate 100 in the bottom surface 407 of the front side opening 81. An optional semiconductor cover layer may be formed over the tunnel dielectric 11 and etched together with the tunnel dielectric to protect the surface of the tunnel dielectric during etching. A semiconductor channel 1 (e.g., polysilicon) may be formed in the front side opening 81, including over the tunnel dielectric 11 on the sidewall 405 of the front side opening 81, and contacting the substrate 100 in the bottom surface 407 of the front side opening 81, as shown in FIG. 4H. An optional insulating fill material 2 (e.g., an oxide, such as silicon oxide) may be formed adjacent to the semiconductor channel 1 and filling the front side openings 81, as shown in FIG. 4H.

Figure 4I:
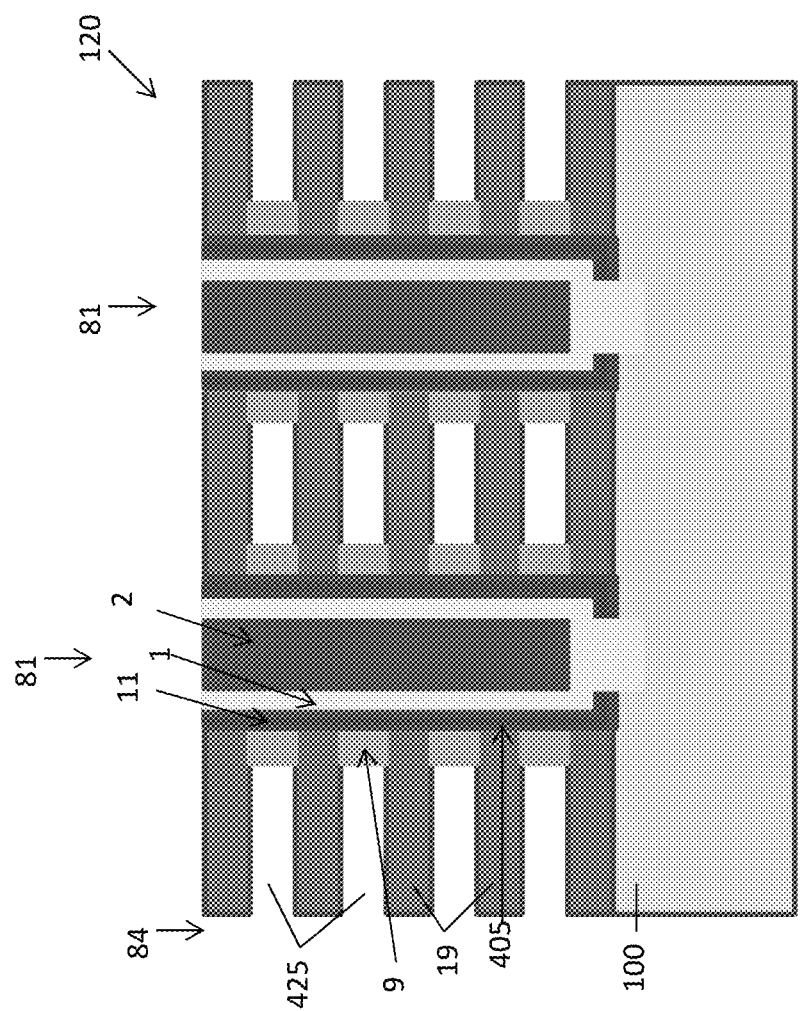

Referring to FIG. 4I, the stack 120 may be etched (e.g., through a mask patterned by photolithography, not shown in FIG. 4I) to form one or more back side openings (e.g., slit trenches) 84 in the stack 120. The back side opening (e.g., trench) 84 may extend through the entire stack 120 to the substrate 100. At least a portion of the second material layers 121 may be removed through the back side opening 84 to form back side recesses 425 between the first material layers 19. Layers 121 may be removed by selective etching, such as a silicon nitride selective etching (e.g., a hot phosphoric acid wet etch) which removes silicon nitride layers 121 but does not remove the silicon oxide layers 19. The selective etch may use the semiconductor charge storage regions 9 as an etch stop.

Figure 4J:
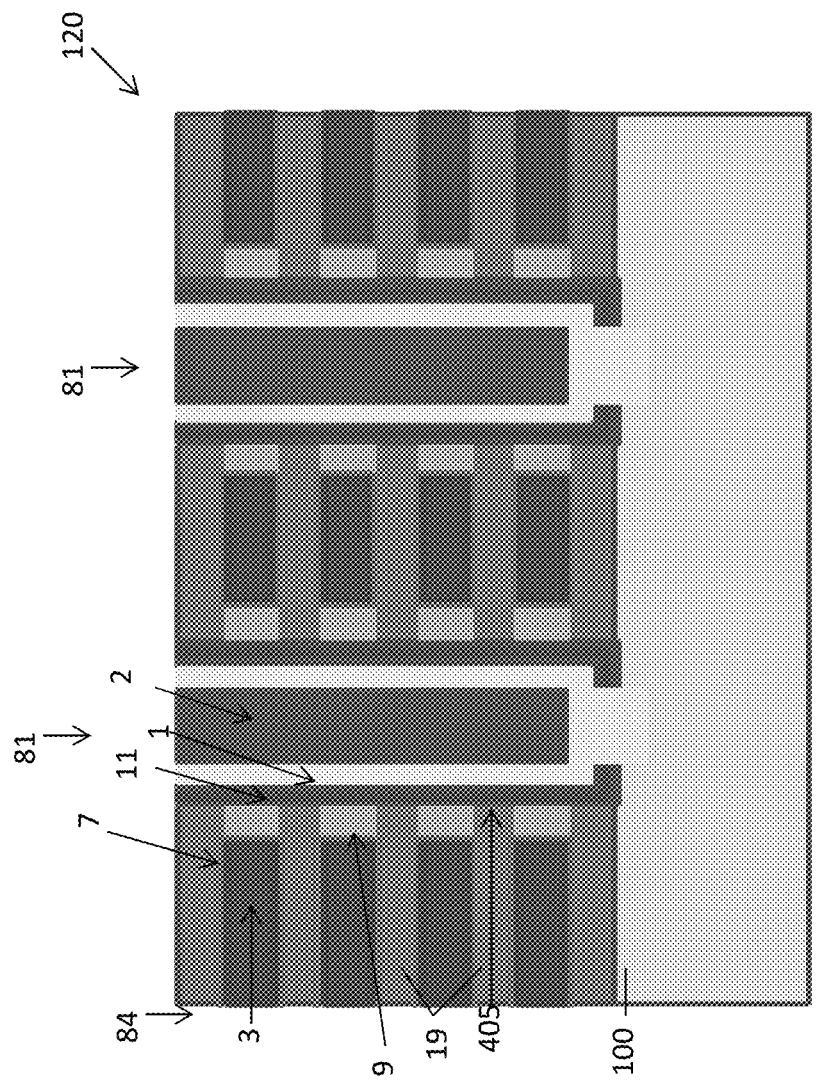

Referring to FIG. 4J, a blocking dielectric 7 may be formed in the back side recesses 425 through the back side opening 84. The blocking dielectric 7 may be formed in contact with the semiconductor charge storage regions 9 exposed within the back side recesses 425. In embodiments, the blocking dielectric 7 may comprise a stack of two or more different insulating layers comprising different insulating materials. For example, the different insulating materials may include silicon oxide, silicon nitride, silicon oxynitride and/or a high-k material such as $Al_2O_3$, $HfO_2$, HfSiO, $Ta_2O_5$ or other metal oxides. In one embodiment, the blocking dielectric 7 may include a stack comprising at least one layer of silicon oxide and at least one layer of a metal oxide, such as aluminum oxide and/or hafnium oxide. In embodiments, the blocking dielectric 7 may include at least one of aluminum oxide and silicon oxynitride.

Referring again to FIG. 4J, control gates 3 may be formed over the blocking dielectric 7 in the back side recesses 425 through the back side opening 84. The control gates 3 may be formed over the blocking dielectric 7 such that the blocking dielectric 7 surrounds each of the control gates 3 on the top, bottom and side surfaces of the control gates 3 facing the semiconductor channel 1. The control gates 3 may comprise one or more electrically conductive materials, such as a metal, metal nitride, metal silicide or heavily doped semiconductor material. In one embodiment, the control gates 3 may be formed by depositing a metal nitride liner material (e.g., tungsten nitride (WN) or titanium nitride (TiN) liner) over the blocking dielectric 7 in the back side recesses 425, followed by depositing a metal material (e.g., tungsten) over the metal nitride liner material to fill the back side recesses 425.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of making a monolithic three dimensional NAND string, comprising:

forming a stack of alternating layers of a first material and a second material different than the first material over a substrate;

etching the stack to form a front side opening in the stack having a sidewall defined at least partially by the alternating layers of the first material and the second material;

removing a first portion of the second material layers through the front side opening to form front side recesses between the first material layers;

forming vertically spaced apart charge storage regions comprising a semiconductor material within the front side recesses, wherein forming the vertically spaced apart charge storage regions comprises:

forming a first layer of the semiconductor material over the first material layers exposed on the sidewall of the front side opening and over the second material layers exposed within the front side recesses, wherein a thickness of the first layer of semiconductor material formed over the second material layers is greater than a thickness of the first layer of semiconductor material formed over the first material layers due to a difference in an incubation time for the semiconductor material on the first material relative to an incubation time for the semiconductor material on the second material; and etching through the front side opening to remove first portions of the semiconductor material from over the first material layers on the sidewall of the front side opening to leave vertically spaced apart second portions of the semiconductor material within the front side recesses;

forming a tunnel dielectric layer over the charge storage regions in the front side opening; and forming a semiconductor channel over the tunnel dielectric layer in the front side opening.

2. The method of claim 1, wherein forming the vertically spaced apart charge storage regions further comprises:

forming a second layer of the semiconductor material over the first material layers exposed on the sidewall of the front side opening and over second portions of the first layer of semiconductor material within the front side recesses; and etching through the front side opening to remove first portions of the second layer of semiconductor material from over the first material layers on the sidewall of the front side opening.

3. The method of claim 2, wherein a thickness of the second layer of semiconductor material formed within the front side recesses is greater than a thickness of the second layer of semiconductor material formed over the first material layers due to a difference in an incubation time for the second layer of semiconductor material on the first material relative to an incubation time for the second layer semiconductor material on the first layer of semiconductor material.

4. The method of claim 2, wherein forming the vertically spaced apart charge storage regions comprises repeatedly forming layers of semiconductor material over the layers of the first material exposed on the sidewall of the front side opening and within the front side recesses and etching through the front side opening to remove portions of the semiconductor material from over the layers of first material on the sidewall of the front side opening until a desired thickness of the semiconductor material within the front side openings is obtained.

5. The method of claim 4, wherein the semiconductor material is formed within the front side recesses to substantially fill the front side recesses.

6. The method of claim 1, wherein the first material layers comprise silicon oxide, the second material layers comprise silicon nitride, and the semiconductor material comprises amorphous silicon or polysilicon.

7. The method of claim 6, wherein the semiconductor material is deposited by CVD.

8. The method of claim 1, wherein etching through the front side opening to remove first portions of the semiconductor material from over the first material layers on the sidewall comprises etching using a reactive ion etching (RIE) process.

9. The method of claim 1, wherein etching through the front side opening to remove first portions of the semiconductor material from over the first material layers on the sidewall comprises etching using a halogen containing gas.

10. The method of claim 1, further comprising:
etching the stack to form a back side opening in the stack;
removing by etching at least a second portion of the second material layers through the back side opening to form back side recesses between the first material layers, wherein the charge storage regions are exposed within the back side recesses;
forming a blocking dielectric over the charge storage regions in the back side recesses through the back side opening; and
forming control gates over the blocking dielectric in the back side recesses through the back side opening.

11. The method of claim 10, further comprising forming one of a source or drain electrode which contacts the semiconductor channel from above, and another one of a source or drain electrode which contacts the semiconductor channel below the stack.

12. The method of claim 10, wherein:
the semiconductor channel has a U-shaped side cross section;
two wing portions of the U-shaped semiconductor channel extend substantially perpendicular to a major surface of the substrate are connected by a connecting portion which extends substantially parallel to the major surface of the substrate;
one of a source or drain electrode contacts the first wing portion of the semiconductor channel from above; and
another one of a source or drain electrode contacts the second wing portion of the semiconductor channel from above.

13. The method of claim 10, wherein:
the substrate comprises a silicon substrate;
the device comprises array of monolithic three dimensional NAND strings over the silicon substrate;
at least one memory cell in the first device level of the three dimensional array of NAND strings is located over another memory cell in the second device level of the three dimensional array of NAND strings; and
the silicon substrate contains an integrated circuit comprising a driver circuit for the memory device located thereon.

14. The method of claim 2, wherein the semiconductor material of the first and the second layers substantially fills the front side recesses to provide the vertically spaced apart charge storage regions comprising the semiconductor material along the sidewall of the front side opening.

15. A method of making a monolithic three dimensional NAND string, comprising:
forming a stack of alternating layers of a first material and a second material different than the first material over a substrate;
etching the stack to form a front side opening in the stack having a sidewall defined at least partially by the alternating layers of the first material and the second material;
removing a first portion of the second material layers through the front side opening to form front side recesses between the first material layers;
selectively forming vertically spaced apart charge storage regions comprising a semiconductor material on the second material layers;
forming a tunnel dielectric layer over the charge storage regions in the front side opening; and
forming a semiconductor channel over the tunnel dielectric layer in the front side opening,
wherein the vertically spaced apart charge storage regions comprise a semiconductor material deposited within the front side recesses, wherein forming the vertically spaced apart charge storage regions comprises:
forming a first layer of the semiconductor material over the first material layers exposed on the sidewall of the front side opening and over the second material layers exposed within the front side recesses, wherein a thickness of the first layer of semiconductor material formed over the second material layers is greater than a thickness of the first layer of semiconductor material formed over the first material layers due to a difference in an incubation time for the semiconductor material on the first material relative to an incubation time for the semiconductor material on the second material; and
etching through the front side opening to remove first portions of the semiconductor material from over the first material layers on the sidewall of the front side opening to leave vertically spaced apart second portions of the semiconductor material within the front side recesses;
forming a second layer of the semiconductor material over the first material layers exposed on the sidewall of the front side opening and over second portions of the first layer of semiconductor material within the front side recesses; and
etching through the front side opening to remove first portions of the second layer of semiconductor material from over the first material layers on the sidewall of the front side opening, wherein the vertically spaced apart charge storage regions comprising the semiconductor material fill entire volumes of the first side recesses, and each of the vertically spaced apart charge storage regions includes a respective vertical sidewall that is physically exposed to an unfilled volume of the front side opening and continuously extends between, and is adjoined to, a sidewall of a respective overlying layer of the first material and a sidewall of a respective underlying layer of the first material.

16. The method of claim 15, wherein the first material layers comprise silicon oxide and the semiconductor material comprises amorphous silicon or polysilicon.

17. The method of claim 15, further comprising:
etching the stack to form a back side opening in the stack;
removing by etching at least a second portion of the second material layers through the back side opening to form back side recesses between the first material layers, wherein the charge storage regions are exposed within the back side recesses;

forming a blocking dielectric over the charge storage regions in the back side recesses through the back side opening;

forming control gates over the blocking dielectric in the back side recesses through the back side opening; and forming one of a source or drain electrode which contacts the semiconductor channel from above, and another one of a source or drain electrode which contacts the semiconductor channel below the stack.

18. The method of claim 14, wherein the vertically spaced apart charge storage regions comprising the semiconductor material fill entire volumes of the first side recesses.

19. The method of claim 18, wherein each of the vertically spaced apart charge storage regions includes a respective vertical sidewall that is physically exposed to an unfilled volume of the front side opening and continuously extends between, and is adjoined to, a sidewall of a respective overlying layer of the first material and a sidewall of a respective underlying layer of the first material.

* * * * *